US007564409B2

(12) United States Patent
Luch

(10) Patent No.: US 7,564,409 B2
(45) Date of Patent: Jul. 21, 2009

(54) ANTENNAS AND ELECTRICAL CONNECTIONS OF ELECTRICAL DEVICES

(75) Inventor: Daniel Luch, Morgan Hill, CA (US)

(73) Assignee: Ertek Inc., Los Altos, CA (US)

( * ) Notice: Subject to any disclaimer, the term of this patent is extended or adjusted under 35 U.S.C. 154(b) by 301 days.

(21) Appl. No.: 11/726,791

(22) Filed: Mar. 23, 2007

(65) Prior Publication Data

US 2007/0182641 A1 Aug. 9, 2007

Related U.S. Application Data

(63) Continuation-in-part of application No. 10/472,875, filed as application No. PCT/US02/09408 on Mar. 25, 2002, now abandoned, application No. 11/726,791, which is a continuation-in-part of application No. 11/223,482, filed on Sep. 8, 2005, now Pat. No. 7,394, 425, which is a continuation-in-part of application No. 10/988,044, filed on Nov. 12, 2004, now Pat. No. 7,452,656, which is a continuation-in-part of application No. 10/408,532, filed on Apr. 7, 2003, now abandoned, which is a continuation-in-part of application No. 09/818,128, filed on Mar. 26, 2001, now Pat. No. 6,582,887.

(51) Int. Cl.
*H01Q 1/38* (2006.01)
*G03F 7/00* (2006.01)

(52) U.S. Cl. ................................ 343/700 MS; 343/906; 430/270.1; 430/311

(58) Field of Classification Search .......... 343/700 MS, 343/866, 906; 430/311, 270.1
See application file for complete search history.

(56) References Cited

U.S. PATENT DOCUMENTS

| | | | |
|---|---|---|---|
| 3,523,875 | A | 8/1970 | Minklei |
| 3,619,382 | A | 11/1971 | Lupinski |
| 3,682,786 | A | 8/1972 | Brown et al. |
| 3,865,699 | A | 2/1975 | Luch |
| 4,009,093 | A | 2/1977 | Luch |
| 4,038,042 | A | 7/1977 | Adelman |
| 4,101,385 | A | 7/1978 | Luch |
| 4,158,612 | A | 6/1979 | Luch et al. |
| 4,191,617 | A | 3/1980 | Hurley et al. |
| 4,195,117 | A | 3/1980 | Luch |
| 4,278,510 | A | 7/1981 | Chien et al. |
| 4,395,362 | A | 7/1983 | Satoh et al. |
| 4,425,262 | A | 1/1984 | Kawai et al. |
| 4,429,020 | A | 1/1984 | Luch |
| 4,510,079 | A | 4/1985 | Kawai et al. |
| 4,603,092 | A | 7/1986 | Luch |
| 4,835,541 | A | 5/1989 | Johnson et al. |
| 4,862,184 | A | 8/1989 | Ploussios |
| 4,985,116 | A | 1/1991 | Mettler et al. |
| 4,985,600 | A | 1/1991 | Heerman |
| 4,996,391 | A | 2/1991 | Schmidt |
| 5,206,657 | A | 4/1993 | Downey |

(Continued)

FOREIGN PATENT DOCUMENTS

| | | |
|---|---|---|
| EP | 0942441 | 9/1999 |

*Primary Examiner*—Tan Ho

(57) ABSTRACT

The invention is to novel articles and methods useful in the mass production of wireless communication devices. Methods and structures to achieve combining of electrical devices such as chips with antennas are disclosed.

23 Claims, 12 Drawing Sheets

U.S. PATENT DOCUMENTS 5,355,142 A 10/1994 Marshall et al.
5,444,453 A 8/1995 Lalezari
5,495,260 A 2/1996 Couture
5,508,709 A 4/1996 Krenz et al.
5,547,516 A 8/1996 Luch
5,567,296 A 10/1996 Luch
5,569,879 A 10/1996 Gloton et al.
5,648,788 A 7/1997 Bumsted
5,709,832 A 1/1998 Hayes et al.
5,735,966 A 4/1998 Luch
5,809,633 A 9/1998 Mundigl et al.
5,847,931 A 12/1998 Gaumet et al.
5,896,111 A 4/1999 Houdeau et al.
5,898,215 A 4/1999 Miller et al.
5,900,841 A 5/1999 Hirata et al.
5,911,454 A 6/1999 Crothall
5,914,690 A 6/1999 Lehtola et al.
5,973,598 A 10/1999 Beigel
5,995,050 A 11/1999 Moller et al.
5,995,052 A 11/1999 Sadler et al.
6,027,027 A 2/2000 Smithgall
6,049,314 A 4/2000 Munson et al.
6,049,463 A 4/2000 O'Malley et al.
6,052,090 A 4/2000 Simmons et al.
6,052,889 A 4/2000 Yu et al.
6,067,056 A 5/2000 Lake
6,075,489 A 6/2000 Sullivan
6,081,236 A 6/2000 Aoki
6,107,920 A 8/2000 Eberhardt et al.
6,137,452 A 10/2000 Sullivan
6,147,660 A 11/2000 Elliott
6,157,344 A 12/2000 Bateman et al.
6,161,761 A 12/2000 Ghaem et al.
6,163,260 A 12/2000 Conwell et al.
6,168,855 B1 1/2001 Cohen et al.
6,184,833 B1 2/2001 Tran
6,195,858 B1 3/2001 Ferguson et al.
6,239,352 B1 5/2001 Luch
6,255,999 B1 7/2001 Faulkener et al.
6,259,369 B1 7/2001 Monico
6,265,977 B1 7/2001 Vega et al.
6,271,793 B1 8/2001 Brady et al.
6,331,838 B1 12/2001 Scott et al.
6,343,208 B1 1/2002 Ying
6,414,235 B1 7/2002 Luch
6,459,032 B1 10/2002 Luch
6,582,887 B2 6/2003 Luch
6,697,248 B1 2/2004 Luch
6,940,408 B2 * 9/2005 Ferguson et al. ......... 340/572.7
7,120,005 B1 10/2006 Luch
7,120,987 B2 * 10/2006 Liu et al. ...................... 29/600
7,224,280 B2 * 5/2007 Ferguson et al. ......... 340/572.7
7,333,061 B2 * 2/2008 Liu et al. .............. 343/700 MS
7,388,542 B2 * 6/2008 Garby et al. .......... 343/700 MS
7,394,425 B2 * 7/2008 Luch .................. 343/700 MS
7,452,656 B2 * 11/2008 Luch ....................... 430/270.1

* cited by examiner

ANTENNAS AND ELECTRICAL CONNECTIONS OF ELECTRICAL DEVICES

CROSS-REFERENCE TO RELATED APPLICATIONS

This application is a Continuation-in-Part of U.S. patent application Ser. No. 10/472,875, filed Sep. 23, 2003 now abandoned and entitled ELECTRICALLY CONDUCTIVE PATTERNS, ANTENNAS, AND METHODS OF MANUFACTURE, which is a National Stage of International Patent Application No. PCT/US02/09408, filed Mar. 25, 2002 and published as WO 02/078122 A1 on Oct. 3, 2002, and entitled ELECTRICALLY CONDUCTIVE PATTERNS, ANTENNAS, AND METHODS OF MANUFACTURE, which claims priority to U.S. patent application Ser. No. 09/818,128, filed Mar. 26, 2001 and entitled ELECTRICALLY CONDUCTIVE PATTERNS, ANTENNAS, AND METHODS OF MANUFACTURE and now U.S. Pat. No. 6,582,887.

This application is also a Continuation-in-Part of U.S. patent application Ser. No. 11/223,482, filed Sep. 8, 2005 now U.S. Pat. No. 7,394,425 and entitled ELECTRICALLY CONDUCTIVE PATTERNS, ANTENNAS, AND METHODS OF MANUFACTURE, which is a Continuation-in-Part of U.S. patent application Ser. No. 10/988,044, filed Nov. 12, 2004 now U.S. Pat. 7,452,656 and entitled ELECTRICALLY CONDUCTIVE PATTERNS, ANTENNAS, AND METHODS OF MANUFACTURE, which is a Continuation-in-Part of U.S. patent application Ser. No. 10/408,532, filed Apr. 7, 2003 now abandoned and entitled ELECTRICALLY CONDUCTIVE PATTERNS, ANTENNAS, AND METHODS OF MANUFACTURE, which is a Continuation-in-Part of U.S. patent application Ser. No. 09/818,128, filed Mar. 26, 2001 and entitled ELECTRICALLY CONDUCTIVE PATTERNS, ANTENNAS, AND METHODS OF MANUFACTURE and now U.S. Pat. No. 6,582,887.

The entire contents of the above identified applications are incorporated herein by this reference.

BACKGROUND OF THE INVENTION

The explosive proliferation of "wireless" electronic devices is to continue into the future. These ubiquitous items include cellular phones and pagers, so-called contactless "smart cards", radio frequency identification (RFID) tags and the emerging wireless data transmission devices. One common component of all these devices is an antenna for receiving and transmitting electromagnetic radiation. Antennas come in many different forms depending on the requirements of the device. However, a common characteristic of most antennas is that they comprise a structural combination of conductive and dielectric insulating materials. One simple form of antenna involves formation of conductive traces or patches on a substantially flat surface. These conductive structures are included in many types of antenna designs, including coil, monopole, dipole and microstrip forms. Examples of these simple antenna structures are those incorporated into contactless "smart cards" and RFID tags. Typically these antennas are formed from a coil or loop of conductive line traces. The coil or loop antenna allows transformer transmission to power the semiconductor chip and also accomplishes data transfer. The cards are generally restricted to a thickness of about 1 millimeter, which dictates that the conductive traces be substantially two dimensional in structure. This relatively simple geometry permits a number of manufacturing options to be considered. For example, U.S. Pat. No. 5,896,111 to Houdeau et al. teaches a technique whereby parallel conductor tracks are formed on strips of flexible, non-conductive carrier strips. The tracks were applied using printing technology, although a detailed description of the materials and processes used to form the tracks was not presented. Bending and connecting opposite ends of adjacent traces results in a substantially planar coil antenna. The technique requires stripping of insulation and individually connecting the opposite ends of adjacent traces which is time consuming and increases manufacturing costs.

U.S. Pat. No. 5,569,879 to Gloton, et al. teaches smart card production comprising lamination of a dielectric onto a prepunched metal strip. In one embodiment a portion of the metal strip is used as part of a microstrip antenna. However, the manufacture includes additional second surface metallization and possibly photo-etching which increases complexity and cost. An additional embodiment of the U.S. Pat. No. 5,569,879 patent shows a portion of the metal strip used as an inductor, but it is not clear how such a geometry would be supported prior to lamination to the dielectric strip.

U.S. Pat. No. 6,067,056 to Lake teaches methods of forming conductive lines and substantially planar antennas by selectively overcoating a first conductive layer with a patterned second conductive layer and etching to remove exposed portions of the first conductive layer. However, etching is wasteful and difficult from an environmental standpoint.

U.S. Pat. No. 5,809,633 to Mundigl et al. teaches manufacturing a coil antenna for a contactless smart card by winding wire in an automatic wire winding machine through a plurality of turns prior to placement on a carrier body. However, the wire used in a smart card antenna must be relatively thin to prevent unacceptable bulges in the final laminated card. Thus it would appear that the unsupported wire bending taught in U.S. Pat. No. 5,809,633 could be difficult to achieve in volume manufacturing.

U.S. Pat. No. 5,898,215 to Miller et al. describes smart card antennas embedded in a plastic laminate. The antenna is formed by winding an insulated copper wire, a process requiring removal of insulation in the region of contact. Alternate methods of manufacture for the antenna such as plating, etching, conductive ink printing and foil lamination were mentioned, although no specific process was taught in detail.

Other teachings for forming antenna structures on substantially flat surfaces involve printing the antenna design onto the surface using conductive inks or pastes. This method is taught, for example, in European Patent Publication EP 0942441A2 to Sugimura, PCT Publication WO 9816901A1 to Azdasht et al. and U.S. Pat. No. 5,900,841 to Hirata et al. These techniques suffer from the relatively high costs of the conductive inks and a high resistivity of these materials compared to substantially pure metals. It also may be difficult to make the required electrical contacts to these conductive inks.

U.S. Pat. No. 5,995,052 to Sadler, et al. and U.S. Pat. No. 5,508,709 to Krenz, et al. illustrate mobile phone antennas comprising conductive structures formed on substantially flat dielectric surfaces. Neither of these disclosures provided a detailed description of methods for forming and adhering the patterned conductive structures onto the dielectric surfaces.

Other techniques for formation of antenna structures on substantially flat surfaces utilize that technology widely employed for manufacture of printed circuits. These manufacturing techniques are taught in the "printed circuit" antenna structures of U.S. Pat. No. 5,709,832 to Hayes et al., U.S. Pat. No. 5,495,260 to Couture, and U.S. Pat. No. 5,206,657 to Downey. Hayes taught production of a printed monopole antenna, while Couture taught a dipole antenna produced using the circuit board techniques. Downey taught production of a coaxial double loop antenna by selective etching of a double metal cladded circuit board. These techniques involve creating a conductive antenna structure on a substantially flat surface through processes involving patterned etching. Techniques for producing antennas by selective etching suffer from excessive material waste, pollution control difficulties and limited design flexibility.

Another form of antenna often employed with wireless communication devices is the so-called "whip" antenna. These antennas normally comprise straight or helical coil wire structures, or combinations thereof, and are often moveable between extended and retracted positions. A typical example of such antenna design is taught in U.S. Pat. No. 5,995,050 to Moller, et al. Moller et al. teaches production of so-called extendable "whip" antennas combining wound helical and straight portions of wire. U.S. Pat. No. 6,081,236 to Aoki taught using a coaxial cable as a radiation element in conjunction with a helical antenna. U.S. Pat. No. 6,052,090 to Simmons, et al. teaches a combination of helical and straight radiating elements for multi-band use. The wire forming techniques proposed in these disclosures are, of course, limited in design flexibility. In many cases, the antenna and especially the helical coil must be encapsulated with insulating material for dimensional and structural integrity as well as aesthetic considerations. This encapsulation is often done by insert injection molding with a thermoplastic encapsulant. Care must be taken to ensure that the high injection pressures and speeds inherent in injection molding do not cause undesirable movement and dimensional changes of the wire coil. This problem was addressed by Bumsted in U.S. Pat. No. 5,648,788. However, the specialized tooling taught by Bumsted would appear to further reduce design flexibility and likely increase costs.

Other problems are associated with the "whip" antennas. They are subject to damage, especially when extended, and can cause inadvertent personal injury. The fact that they must be retractable increases mechanical wear and limits possible size reductions for the device. U.S. Pat. No. 6,075,489 to Sullivan addresses this latter problem by teaching a telescoping "whip" antenna combining a helix mounted on slidable components to enable telescopic extension. This design allows a longer antenna but increases complexity and cost and increases possibility of damage when extended.

As size continues to be an issue, increasing attention is devoted toward conformal antennas. Conformal antennas generally follow the shape of the surface on which they are supported and generally exhibit a low profile. There are a number of different types of conformal antennas, including microstrip, stripline, and three dimensional designs.

The low-profile resonant microstrip antenna radiators generally comprise a conductive radiator surface positioned above a more extensive conductive ground plane. The conductive surfaces are normally substantially opposing and spaced apart from one another. The substantially planar conductive surfaces can be produced by well-known techniques such as conductive coating, sheet metal forming or photoetching of doubly clad dielectric sheet.

A factor to consider in design and construction of high efficiency microstrip antennas is the nature of the separating dielectric material. U.S. Pat. No. 5,355,142 to Marshall, et al. and U.S. Pat. No. 5,444,453 to Lalezari teach using air as the dielectric. This approach tends to increase the complexity of manufacture and precautions must be made to ensure and maintain proper spacing between radiator and ground plane.

U.S. Pat. No. 6,157,344 to Bateman, et al. teaches manufacture of flat antenna structures using well known photomasking and etching techniques of copper cladded dielectric substrates.

U.S. Pat. No. 6,049,314 to Munson, et al., U.S. Pat. No. 4,835,541 to Johnson, et al. and U.S. Pat. No. 6,184,833 to Tran all teach manufacture of a microstrip antennas produced by cutting and forming an initially planar copper sheet into the form of a "U". Cutting and forming of planar metal sheets offers limited design options. In addition, provision must be made to provide a dielectric supporting structure between the two arms of the "U" since the sheet metal would likely not maintain required planar spacing without such support.

One notes that most of the technologies for antenna production involve the placement and combining of conductive material patterns with either a supportive or protective dielectric substrate. Antenna production often involves the production of well-defined patterns, strips or traces of conductive material held in position by a dielectric material.

As technology evolves, consumers have demanded a greater number of features incorporated in a specific device. These requirements tend to increase the size of the device. Simultaneously, there has been the need to make these portable devices smaller and lighter to maximize convenience. These conflicting requirements extend to the antenna, and attempts have been made to advance the antenna design toward three dimensional structures to maximize performance and minimize size.

For example, U.S. Pat. No. 5,914,690 to Lehtola et al. teaches an internal conformal antenna of relatively simple, three dimensional construction for a wireless portable communication device. The antenna comprises an assembly of multiple pieces. A radiator plate is positioned between a cover structure and a support frame positioned over and connected to an electrically conductive earth plane. The radiator plate is formed from a flexible thin metal plate. The multiple pieces required for accurate positioning of the radiator plate relative to the earth plane increases the manufacturing cost of the Lehtola et al. structures.

Unfortunately, more complicated three dimensional metal-based patterns often required for antenna manufacture can be difficult or impossible to produce using conventional mechanical wire winding, sheet forming or photoetching techniques. Photoetching requires a conforming mask to define the circuitry. U.S. Pat. No. 5,845,391 to Bellus, et al. illustrates the complications associated with prior art photoetch methods of forming three dimensional metallic patterns on a dielectric substrate. Bellus, et al. teaches manufacture of a three dimensional tapered notch antenna array formed on an injected molded thermoplastic grid. Multiple operations, specialized masking and other complications are involved in production of the photoetched metallic patterns. In addition, the metallic patterns produced were still restricted to a three dimensional structure made up of essentially flat dielectric panels.

Mettler et al., U.S. Pat. No. 4,985,116 taught the use of thermoforming a plastic sheet coated with a vacuum formable ink into a mask having the surface contour of a three dimensional article. A computer controlled laser is used to remove ink in a desired patterned design. The mask was then drawn tightly to a resist coated workpiece. Using known methods of photo and metal deposition processing, a part having patterned three dimensional structure is produced. The Mettler, et al. patent also discussed the limitations of using a photomask on a three dimensional substrate by using the example of a mushroom. A photomask cannot easily conform to the stem of the mushroom while still permitting the mask to be installed or removed over the cap of the mushroom. Thus, a significant limitation on design flexibility exists with conventional photoetching techniques for production of three dimensional antenna structures.

A number of patents envision antenna structures comprising metal-based materials deposited into trenches or channels formed in a dielectric support. For example, Crothall in U.S. Pat. No. 5,911,454 teaches a method of forming a strip of conductive material by depositing a conductive material into a channel formed by two raised portions extending upward from a surface of an insulating material. The conductive material was deposited to overlay portions of the raised material. The conductive material overlaying the raised portions was then removed to result in a sharply defined conductive strip. The process taught by Crothall is clearly limited in its design flexibility by the material removal requirement. Ploussios, U.S. Pat. No. 4,862,184 teaches deposition of metal into a helical channel support. The selective deposition process was described only to the extent that it was achieved by known plating techniques. U.S. Pat. No. 4,996,391 to Schmidt and U.S. Pat. No. 4,985,600 to Heerman both teach injection molded substrates upon which a circuit is applied. In both patents, the pattern of the eventual circuitry is molded in the form of trenches or depressions below a major, substantially planar surface. In this way, plating resist lacquer applied by roller coating will coat only those surface areas of the major, substantially planar surface, and subsequent chemical metal deposition occurs only in the trenches remaining uncoated by the plating resist. This technique avoids the complications of photoetching, but is still design limited by the requirement of applying the plating resist. Application of the plating resist becomes increasingly difficult as the contours of the major surface become more complicated. In addition, chemical metal deposition is relatively slow in building thickness and the circuitry used is relatively expensive.

As wireless communication devices continue to evolve, the demands on the design, size and manufacturability of the required antennas will become increasingly challenging. There is clearly a need for improved materials, processes and manufacturing techniques to produce the antennas of the future.

U.S. Pat. No. 6,052,889 to Yu, et al. teaches a method for preparing a radio frequency antenna having a plurality of radiating elements. The three dimensional assembly includes multiple steps including electroless metal deposition on components to a metal thickness of at least 0.0015 inch. Electroless metal deposition involves relatively slow deposition rates and thus extended processing times are required to deposit such thickness. The Yu, et al. teaching also involves photoetching to selectively remove metal, further complicating the methods taught.

Elliott, in U.S. Pat. No. 6,147,660 addresses the design limitations intrinsic in helical wire-winding processing and teaches use of a molded helical antenna. Techniques taught to produce the molded antennas included zinc die casting, metal injection molding, or molding of a material such as ABS which can be plated by conventional technology. Elliot taught non-circular or non-symmetrical helical antennas, difficult to manufacture by conventional wire winding methods. Nevertheless, the manufacturing methods proposed would be difficult and costly.

A number of recent approaches to production of improved antennas involves a technology generally described as "plating on plastics". The "plating on plastics" technology is intended to deposit an adherent coating of a metal or metal-based material onto the surface of a plastic substrate. "Plating on plastic" envisions the deposition of an initial metal coating using "electroless" plating followed by an optional deposition of metal using electrodeposition. Electroless plating involves chemically coating a nonconductive surface such as a plastic with a continuous metallic film. Unlike conventional electroplating, electroless plating does not require the use of electricity to deposit the metal. Instead, a series of chemical steps involving etchants and catalysts prepare the non-conductive plastic substrate to accept a metal layer deposited by chemical reduction of metal from solution. The process usually involves depositing a thin layer of highly conductive copper followed by a nickel topcoat which protects the copper sublayer from oxidation and corrosion. The thickness of the nickel topcoat can be adjusted depending on the abrasion and corrosion requirements of the final product. Because electroless plating is an immersion process, uniform coatings can be applied to almost any configuration regardless of size or complexity without a high reliance on operator skill. Electroless plating also provides a highly conductive, essentially pure metal surface. Electrolessly plated parts can be subsequently electroplated if required.

Unfortunately, the "plating on plastics" process comprises many steps involving expensive and harsh chemicals. This increases costs dramatically and involves environmental difficulties. The process is very sensitive to processing variables used to fabricate the plastic substrate, limiting applications to carefully molded parts and designs. It may be difficult to properly mold conventional plateable plastics using the rapid injection rates often required for the thin walls of electronic components. The rapid injection rates can cause poor surface distribution of etchable species, resulting in poor surface roughening and subsequent inferior bonding of the chemically deposited metal. Finally, the rates at which metals can be chemically deposited are relatively slow, typically about one micrometer per hour. The conventional technology for metal plating on plastic (etching, chemical reduction, optional electroplating) has been extensively documented and discussed in the public and commercial literature. See, for example, Saubestre, Transactions of the Institute of Metal Finishing, 1969, Vol. 47, or Arcilesi et al., Products Finishing, March 1984.

Despite the difficulties, a number of attempts have been made to utilize the "plating on plastics technology for the production of antennas. Most antenna applications involve selective placement of a metal conductor in relation to an insulating material. Selective metallization using the "plating on plastics" technology can be achieved in a number of ways. A first method is to coat the entire insulating substrate with metal and then selectively remove metal using photoetching techniques that have been used for many years in the production of printed circuits. However, these techniques are very limited in design flexibility, as discussed previously. A second method is to apply a plating stopoff coating prior to chemically depositing the metal. The stopoff is intended to prevent metal deposition onto the coated surfaces. This approach was incorporated into the teachings of Schmidt, U.S. Pat. No. 4,996,391, and Heerman, U.S. Pat. No. 4,985,600 referenced above. This approach is design limited by the need for the stopoff coating. Another more recent approach is to incorporate a plating catalyst into a resin and to combine the "catalyzed resin with an "uncatalyzed" resin in a two shot molding operation. Only the surfaces formed by the "catalyzed" resin will stimulate the chemical reaction reducing metal, and thus conceptually only those surfaces will be metallized. This approach is taught, for example, in U.S. Pat. No. 6,137,452 to Sullivan.

Selective metallizing using either stopoff lacquer of catalyzed resin approaches can be difficult, especially on complex parts, since the electroless plating may tend to coat any exposed surface unless the overall process is carefully controlled. Poor line definition, "skip plating" and complete part coverage due to bath instabilities often occurs. Despite much effort to develop consistent and reliable performance through material and process development, these problems still remain.

Many attempts have been made to simplify the process of plating on plastic substrates. Some involve special chemical techniques, other than electroless metal deposition, to produce an electrically conductive film on the surface followed by electroplating. Typical examples of the approach are taught by U.S. Pat. No. 3,523,875 to Minklei, U.S. Pat. No. 3,682,786 to Brown et. Al., and U.S. Pat. No. 3,619,382 to Lupinski. The electrically conductive surface film produced was intended to be electroplated. Multiple performance problems thwarted these attempts.

Another approach proposed to simplify electroplating of plastic substrates is incorporation of electrically conductive fillers into the resin to produce an electrically conductive plastic which is then electroplated. In a discussion of polymers rendered electrically conductive by loading with electrically conductive fillers, it may be important to distinguish between "microscopic resistivity" and "bulk" or "macroscopic resistivity". "Microscopic resistivity" refers to a characteristic of a polymer/filler mix considered at a relatively small linear dimension of for example 1 micrometer or less. "Bulk", or "macroscopic resistivity" refers to a characteristic determined over larger linear dimensions. To illustrate the difference between "microscopic" and "bulk, macroscopic" resistivities, one can consider a polymer loaded with conductive fibers at a fiber loading of 10 weight percent. Such a material might show a low "bulk, macroscopic" resistivity when the measurement is made over a relatively large distance. However, because of fiber separation (holes) such a composite might not exhibit consistent "microscpic" resistivity.

When considering producing an electrically conductive polymer intended to be electroplated, one should consider "microscopic resistivity" in order to achieve uniform, "hole-free" deposit coverage. Thus, the fillers chosen will likely comprise those that are relatively small, but with loadings sufficient to supply the required conductive contacting. Such fillers include metal powders and flake, metal coated mica or spheres, conductive carbon black and the like.

Any attempt to make an acceptable directly electroplateable resin using the relatively small metal containing fillers alone encounters a number of barriers. First, the fine metal containing fillers are relatively expensive. The loadings required to achieve the particle to particle proximity to achieve acceptable conductivity increases the cost of the polymer/filler blend dramatically. The metal containing fillers are accompanied by further problems. They tend to cause deterioration of the mechanical properties and processing characteristics of many resins, limiting options in resin selection. Metal fillers can be abrasive to processing machinery and may require specialized screws, barrels and the like. Finally, despite being electrically conductive, a simple metal-filled polymer still offers no mechanism to produce adhesion of an electrodeposit since the metal particles are generally encapsulated by the resin binder. For the above reasons, fine metal particle containing plastics have not been considered for production of directly electroplateable articles. Rather, they have found applications in production of conductive adhesives, pastes, and paints where volume requirements are minimized.

The least expensive (and least conductive) of the readily available conductive fillers for plastics are carbon blacks. Attempts have been made to produce electrically conductive polymers based on carbon black loading intended to be subsequently electroplated. An example of this approach is the teaching of Adelman in U.S. Pat. No. 4,038,042. Adelman taught incorporation of conductive carbon black into a polymeric matrix to achieve electrical conductivity required for electroplating. The substrate was pre-etched in chromic/sulfuric acid to achieve adhesion of the subsequently electrodeposited metal. A fundamental problem remaining unresolved by the Adelman teaching is the relatively high resistivity of carbon black loaded polymers. The lowest microscopic resistivity generally achievable with carbon black loaded polymers is about 1 ohm-cm. This is about five to six orders of magnitude higher than typical electrodeposited metals such as copper or nickel. In electrodeposition, the workpiece to be plated is normally made cathodic through a pressure contact to a metal rack tip, itself under cathodic potential. However, if contact resistance is excessive or the workpiece is insufficiently conductive, the electrodeposition current favors the rack tip to the point where the electrodeposit will not bridge to the workpiece. Moreover, a further problem is encountered even if specialized racking successfully achieves electrodeposit bridging to the workpiece. Since the carbon black loaded workpiece is of relatively high resistivity compared to metal, most of the electroplating current must pass back through the previously electrodeposited metal, the electrodeposit growing laterally over the surface of the workpiece. As with the bridging problem, the electrodeposition current favors the electrodeposited metal and the lateral growth can be extremely slow, restricting sizes for the workpiece.

Luch in U.S. Pat. No. 3,865,699 taught incorporation of small amounts of sulfur into polymer-based compounds filled with conductive carbon black. The sulfur was taught to have two advantages. First, it participated in formation of a chemical bond between the polymer-based substrate and an initial Group VIII based metal electrodeposit. Second, the sulfur increased lateral growth of the Group VIII based metal electrodeposit over the surface of the substrate.

Since the polymer-based compositions taught by Luch could be electroplated directly without any pretreatment, they could be accurately defined as directly electroplateable resins (DER). Directly electroplateable resins, (DER), are defined and characterized in this specification and claims by the following features.

(a) having a polymer matrix;

(b) presence of conductive fillers in the polymer matrix in amounts sufficient to have a "microscopic" electrical volume resistivity of the polymer/conductive filler mix of less than 1000 ohm-cm., e.g. 100 ohm-cm., 10 ohm-cm., 1 ohm-cm.

(c) presence of sulfur (including any sulfur provided by sulfur donors) in amounts greater than about 0.1% by weight of the polymer matrix; and (d) presence of the polymer, conductive filler and sulfur in the directly electroplateable composition in cooperative amounts required to achieve direct, uniform, rapid and adherent coverage of said composition with an electrodeposited Group VIII metal or Group VIII metal-based alloy.

Polymers such as polyvinyls, polyolefins, polystryrenes, elastomers, polyamides, and polyesters were identified by Luch as suitable for a DER matrix, the choice generally being dictated by the physical properties required.

When used alone, the minimum workable level of carbon black required to achieve "microscopic" electrical resistivities of less than 1000 ohm-cm. for the polymer/carbon black mix appears to be about 8 weight percent based on the combined weight of polymer plus carbon black. The "microscopic" material resistivity generally is not reduced below about 1 ohm-cm. by using conductive carbon black alone. This is several orders of magnitude larger than typical metal resistivities. Other well known, finely divided highly conductive fillers (such as metal flake) can be considered in DER applications requiring lower "microscopic" resistivity. In these cases the more highly conductive fillers can be used to augment or even replace the conductive carbon black.

The "bulk, macroscopic" resistivity of conductive carbon black filled polymers can be further reduced by augmenting the carbon black filler with additional highly conductive, high aspect ratio fillers such as metal containing fibers. This can be an important consideration in the design of the antenna structures and circuitry of the present invention. Furthermore, one should realize that incorporation of non-conductive fillers may increase the "bulk, macroscopic" resistivity of conductive carbon black filled polymers without significantly altering the "microscopic resistivity" of the polymer/carbon black mix.

Due to multiple performance problems associated with their intended end use, none of the attempts to simplify the process of plating on plastic substrates identified above has ever achieved any recognizable commercial success. Nevertheless, the current inventor has persisted in personal efforts to overcome certain performance deficiencies associated with the initial DER technology. Along with these efforts has come a recognition of unique and eminently suitable applications employing DER for the production of complex, highly conductive surface traces, circuitry, and antennas.

It is important to recognize two important aspects characteristic of directly electroplateable resins (DERs) which facilitate the current invention. First, electrodeposit coverage speed and adhesion depend strongly on the "microscopic resistivity" and less so on the "macroscopic resistivity". Thus, large additional loadings of functional non-conductive fillers can be tolerated in DER formulations without undue sacrifice in electrodeposit coverage speed or adhesion. These additional non-conductive loadings do not greatly affect the "microscopic resistivity" associated with the polymer-conductive filler-sulfur "matrix" since the non-conductive filler is essentially encapsulated by "matrix" material. Conventional "electroless" plating technology does not permit this compositional flexibility.

A second important characteristic of DER technology is its ability to employ polymer resins generally chosen in recognition of the fabrication process envisioned and the intended end use requirements. For example, should an extrusion blow molding fabrication be desired, resins having the required high melt strength can be employed. Should the part be injection molded and have thin wall cross sections, a high flow resin can be chosen. All thermoplastic fabrication processes require specific resin processing characteristics for success. The ability to "custom formulate" DERs to comply with these changing processing and end use requirements while still allowing facile, quality electroplating is a significant factor in the success of the electrically conductive patterns and antennas of the current invention. Conventional "electroless" plating technology does not permit great flexibility to "custom formulate".

In order to eliminate ambiguity in terminology of the present specification and claims, the following definitions are supplied.

"Metal-based" refers to a material having metallic properties comprising one or more elements, at least one of which is a metal.

"Metal-based alloy" refers to a substance having metallic properties and being composed of two or more elements of which at least one is a metal.

"Polymer-based" refers to a substance composed, by volume, of 50 percent or more polymer.

"Group VIII-based" refers to a metal (including alloys) containing, by weight, 50 percent to 100 percent metal from Group VIII of the Periodic Table of Elements.

OBJECTS OF THE INVENTION

An object of the invention is to produce new structures for highly conductive surface patterns and traces, complex circuitry, antennas and wireless components.

A further object of the invention is to produce novel methods of facile high-volume manufacture of highly conductive surface patterns and traces, complex circuitry, antennas, and wireless components.

SUMMARY OF THE INVENTION

The present invention involves production of patterned surfaces comprising electroplateable resins and specifically directly electroplateable resins. The electroplateable resins can be self-supporting, but often is used in combination with an electrically insulating support material. In preferred embodiments the electroplateable resin is further coated with an adherent layer of highly conductive electrodeposit. Novel manufacturing methods and structures made possible by the use of directly electroplateable resins are taught.

The invention further contemplates novel techniques for mass production of wireless devices and electrical connections.

DESCRIPTION OF THE PREFERRED EMBODIMENTS

Figure 1:
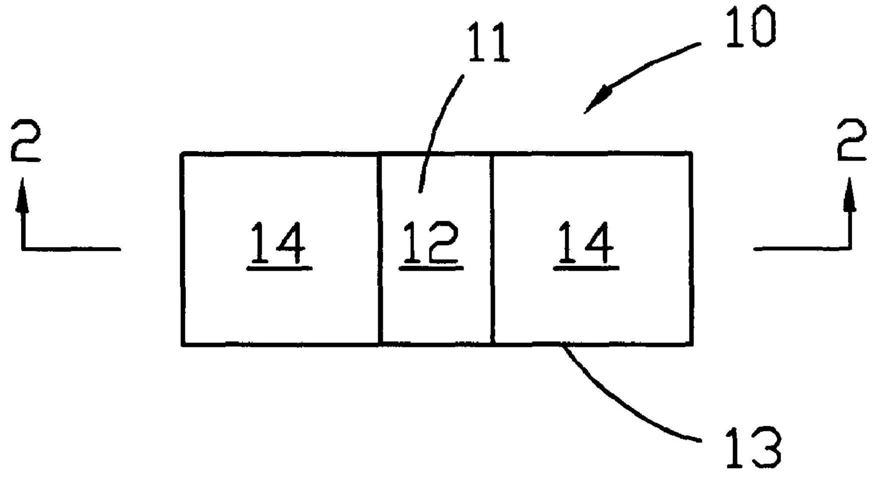
FIG. 1 is a top plan view of an embodiment of the invention.

The following teaching of preferred embodiments, taken along with the descriptive figures, will reveal and teach the eminently suitable characteristics of electroplateable resins and specifically directly electroplateable resins in the production of antennas and complex, three dimensional electrically conductive surface traces. In the following, the acronym "DER" will be used to designate a directly electroplateable resin. A number of unique characteristics of DER formulations allow these advances. Specifically, high flow formulations have been demonstrated which permit molding of thin-walled parts and extended conductive traces required in present electronic applications. High loadings of additional fillers, such as glass fiber, can be employed to solve dimensional stability and shrinkage issues without adversely affecting plateability. This is a result of the recognition that plateability issues with DER's are controlled by "microscopic resistivity" rather than "macroscopic resistivity". The unique ability to custom formulate DER's allows production of complex, selectively plated structures using processing techniques such as dual shot molding, blow molding, extrusion and coating. Fine line edge definition can be readily achieved. Unique electrical joining techniques between metallic leads and electroplated DER are possible. These and other attributes of DER's in production of antennas and complex conductive surface traces will become clear through the following remaining specification and accompanying figures.

Reference will now be made in detail to the preferred embodiments of the invention, examples of which are illustrated in the accompanying drawings. In the drawings, like reference numerals designate identical or corresponding parts throughout several views and an additional letter designation is characteristic of a particular embodiment.

Figure 2:
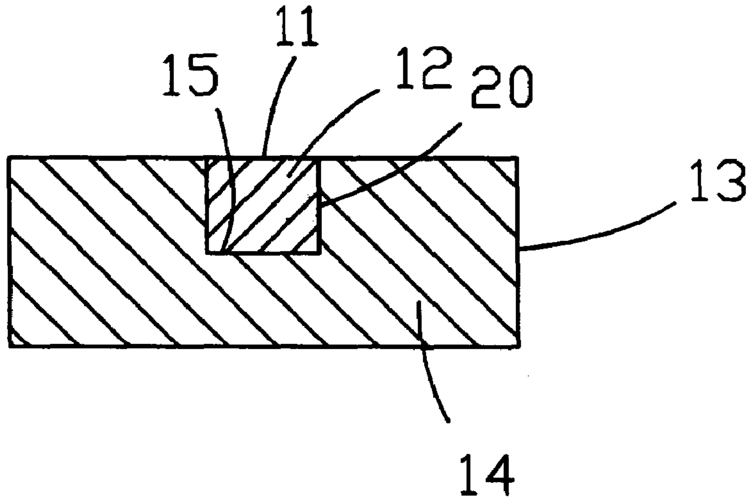
FIG. 2 is a sectional view of the FIG. 1 embodiment taken substantially from the perspective of line 2-2 of FIG. 1.
Figure 3:
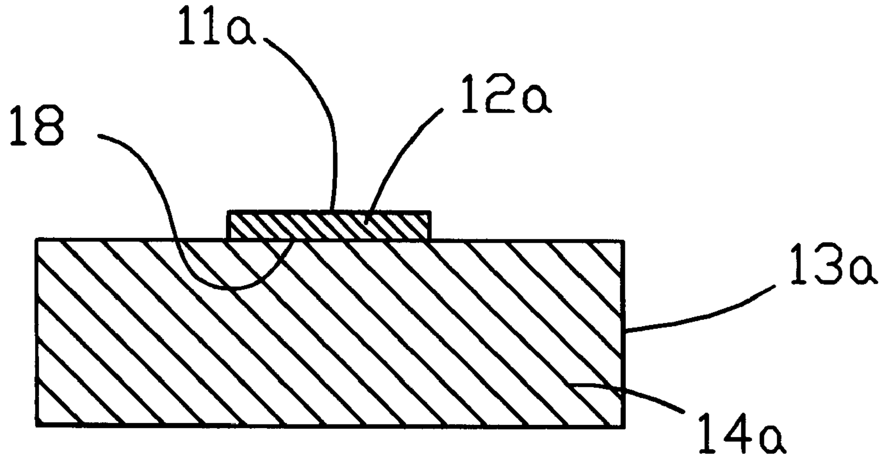
FIG. 3 is a sectional view, similar to FIG. 2, of an alternate embodiment.

Referring to FIG. 1, there is shown a top plan view of an article generally designated by numeral 10. Article 10 is characterized by having a stripe 11 of directly electroplateable resin (DER) 12 supported by a substrate 13 comprising electrically insulating resin 14. FIG. 2 is a sectional view of the FIG. 1 structure taken substantially along the line 2-2 of FIG. 1. As shown in FIG. 2, DER material 12 is contained in a trench 15 formed in substrate 13. FIG. 3 is a view similar to FIG. 2 of an alternate embodiment wherein DER material **12*a* is formed as a stripe 11*a* on the top, essentially flat surface of substrate 13*a*. It has been found that the structure of FIG. 2 is often desirable by permitting greater latitude in the selection of materials for the DER binder and the insulating support. For example, structural features can be introduced into the abutting surfaces 20 of the trench 15 of FIG. 2 to assist in mechanical retention of the DER stripe 11. The simple abutting flat surfaces at 18 of the FIG. 3 embodiment may be simpler to produce than the FIG. 2 trench structure, but the FIG. 3 arrangement generally requires good adhesive compatibility between the DER 12*a* and insulating material 14*a* of support substrate 13*a***.

Figure 4:
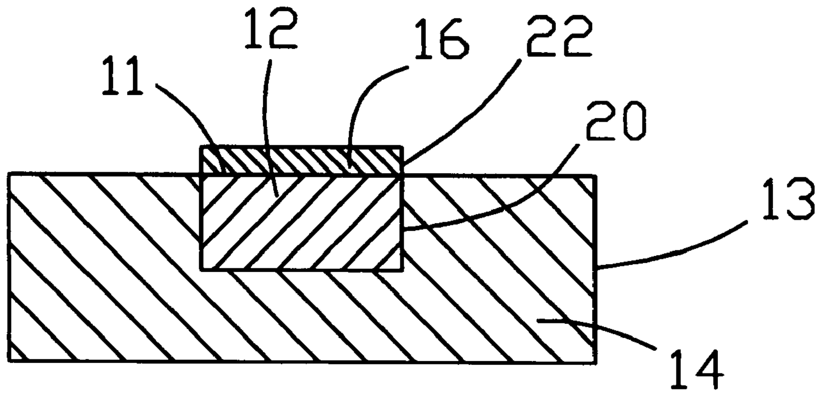
FIG. 4 is a sectional view of the embodiment of FIG. 2 following an additional processing step.

Referring now to FIG. 4, the structure of FIG. 2 is shown following an additional processing step of electrodepositing metal-based material 16 onto the DER stripe 11. Metal-based electrodeposit 16 is shown in FIG. 4 as a single layer. However, it is understood that electrodeposit 16 in this and subsequent embodiments can comprise a laminate of multiple layers of electrodeposit to achieve functional or aesthetic benefits. Electrodeposit 16 can also comprise dispersed particles.

Continuing to refer to FIG. 4, it has been found that penetration of electroplating solution into the abutting surface region 20 does not readily occur (and thus is generally not a problem) even when there is reduced adhesive compatibility between the DER material 12 and substrate material 14. The abutting surfaces at 20 are generally in close proximity and the electroplating solution is incapable of necessary air displacement to allow such penetration. In addition, the polymers chosen for DER 12 and substrate 13 are often hydrophobic and would generally resist such penetration of solution. Were penetration of electroplating solution into the interfacial region 20 to become a problem, one could choose a material for substrate 13 having a lower coefficient of thermal expansion than the DER 12. In this way, the DER would form an expanded "plug" at the elevated temperatures of the electroplating baths to temporarily seal the interfacial gap.

Figure 5:
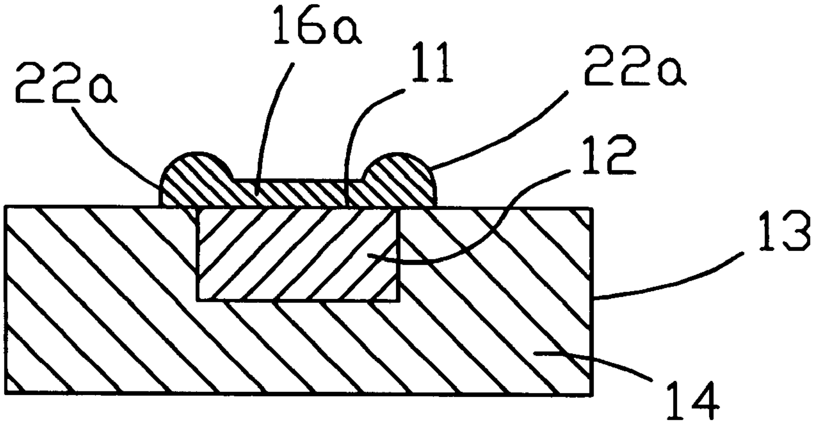
FIG. 5 is a sectional view similar to FIG. 4 illustrating a problem associated with the additional processing included in the FIG. 4 embodiment.

Continuing to refer to FIG. 4, there is shown a sharp line of demarcation at the edges 22 of electrodeposit 16. This sharp line is achieved by the electrically "digital" nature of surface conductivity between the conductive DER 12 and insulating substrate material 14. Using proper electroplating practice known in the art, sharp edge or line definition can be expected and achieved up to electrodeposit thicknesses of typically 25 micrometer. However, reference to FIG. 5, a view similar to FIG. 4, illustrates an effect of electrodeposition which can blur line definition at thicker electrodeposits or where there is deviation from optimal processing. FIG. 5 shows a substantial increase in thickness of electrodeposit **16*a* at edges 22*a***. This phenomenon, known as "berry buildup", results from the well-known tendency of electrodeposits to concentrate deposition at edges or sharp corners. In many cases this characteristic results in formation of nodules (or berries) which further accentuates the detrimental effect.

Figure 6:
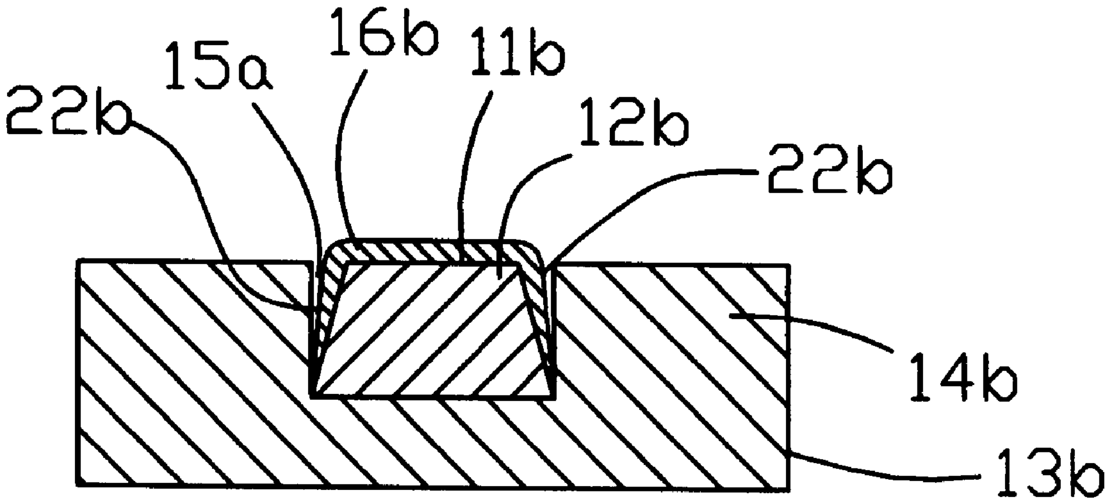
FIG. 6 is a sectional view teaching an alternative structure to eliminate the problem illustrated in the FIG. 5 embodiment.
Figure 7:
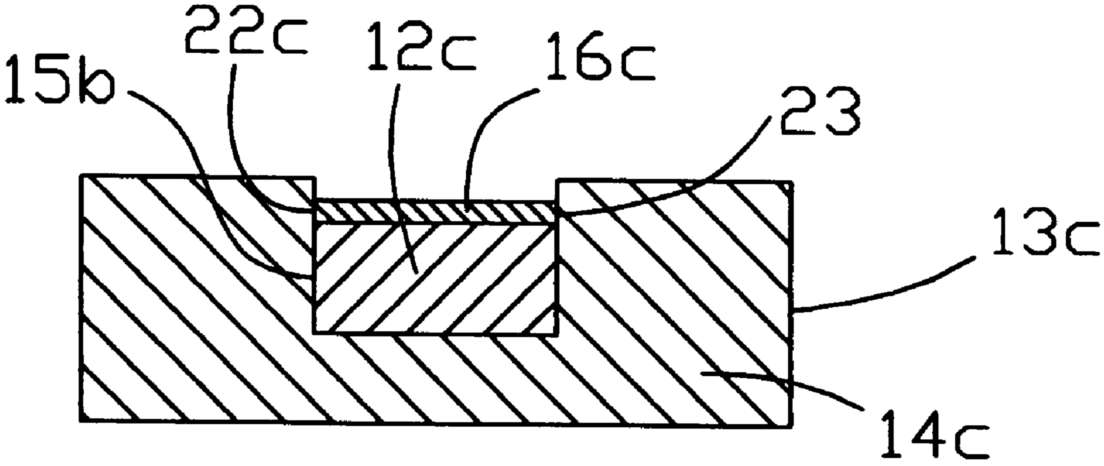
FIG. 7 is a sectional view teaching an additional alternative structure to eliminate the problem illustrated in the FIG. 5 embodiment.

Reference to FIGS. 6 and 7 is made to show how the blurring of line definition at electrodeposit edges can be avoided using the teachings of the instant invention. In FIG. 6, there is shown a structure wherein the DER material 12*b* does not completely fill the trench 15*a* formed in substrate 13*b*. Here the edges 22*b* of electrodeposited metal-based material 16*b* are positioned in a depression or recess. It is known that recessed areas receive reduced amounts of electrodeposited material, the opposite effect to having a raised sharp edge. Thus, proper choice of the width and depth of the recess provides for maintenance of adequately sharp line definition for the selectively conductive surface patterns of the current invention when thick metal layers are demanded.

FIG. 7 shows an alternate design embodiment intended to produce a sharp line demarcation between conductive electrodeposit 16*c* and insulating substrate 13*c*. In the FIG. 7 embodiment, DER material 12*c* does not completely fill the trench 15*b* formed in substrate 13*c*. Nodule or "berry" buildup at edges 22*c* of electrodeposit 16*c* is prevented by the shielding effect of trench walls 23 of substrate 13*c*, thereby containing the lateral extent of electrodeposit 16*c*.

Figure 8:
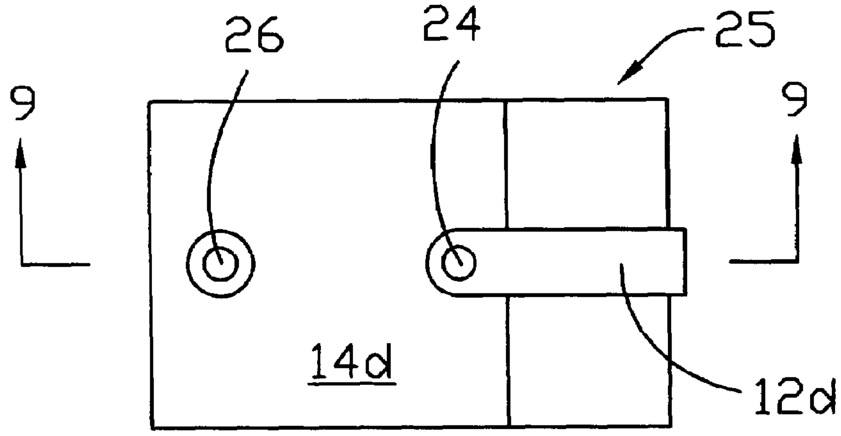
FIG. 8 is a top plan view of an intermediate article in the manufacture of a three dimensional conductive trace according to the teachings of the invention.
Figure 9:
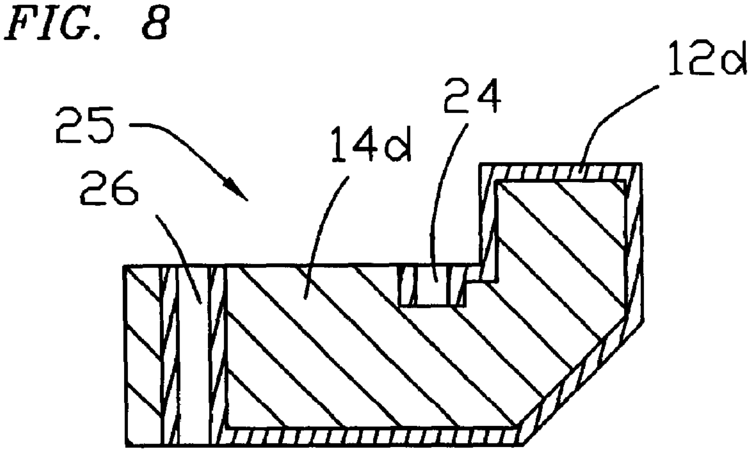
FIG. 9 is a sectional view taken substantially from the perspective of line 9-9 of FIG. 8.
Figure 10:
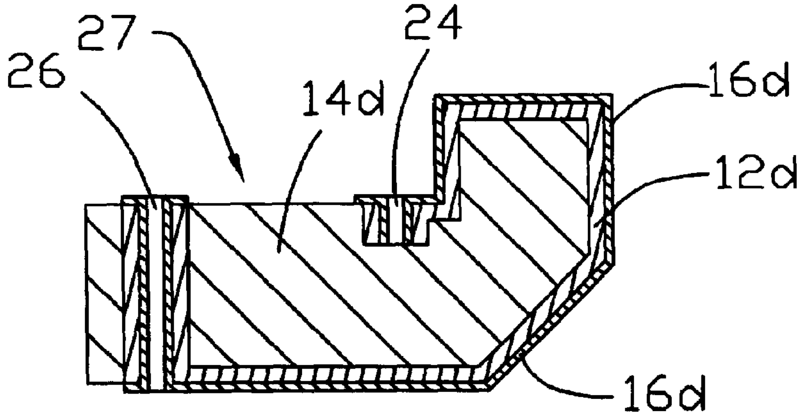
FIG. 10 is a sectional view of the article of FIGS. 8 and 9 following an additional processing step.

FIGS. 1 through 7 illustrate embodiments of production of simple electrically conductive traces or strips supported by an insulating substrate. A more complex, three dimensional structure is illustrated in the embodiments of FIGS. 8 and 9. These figures illustrate a multicomponent article using DER to produce a geometrically complex three dimensional conductive pattern. In FIGS. 8 and 9, DER material is identified as numeral 12*d*, and insulating material as 14*d*. It is contemplated that the article of FIGS. 8 and 9 is produced by a multi-component (generally referred to as multi-color) molding process. In one form of this process, an insulating substrate is first molded with channels defining a pattern intended for the eventual conductive pattern. DER material is then injected into the channels. FIGS. 8 and 9 also illustrate a well 24 and through-hole 26 which are molded into the object. FIG. 10 illustrates the article, now identified as 27, following exposure to an electroplating process. In FIG. 10, numeral 16*d* indicates the electrodeposit. Electrodeposit 16*d* is understood to be either a single layer or multiple layers of metal-based material as is understood in the electroplating art. The electrodeposit supplies a robust, highly conductive surface pattern that would be difficult to produce or achieve by alternate techniques currently available, such as photoetching. It is also important to recognize that the unique design and process taught by the present disclosure is accomplished in a fully additive fashion. No wasteful or costly material removal steps are needed to achieve most of the embodiments of the invention, a significant advantage over the prior art.

In most applications, the conductive pattern produced by the DER/electrodeposit must be electrically connected to the electrical leads of a device such as a chip, capacitor, etc. In many cases these connections are made by high temperature soldering. This process can limit the selection of materials and processes used for production of the integrated device.

Figure 11:
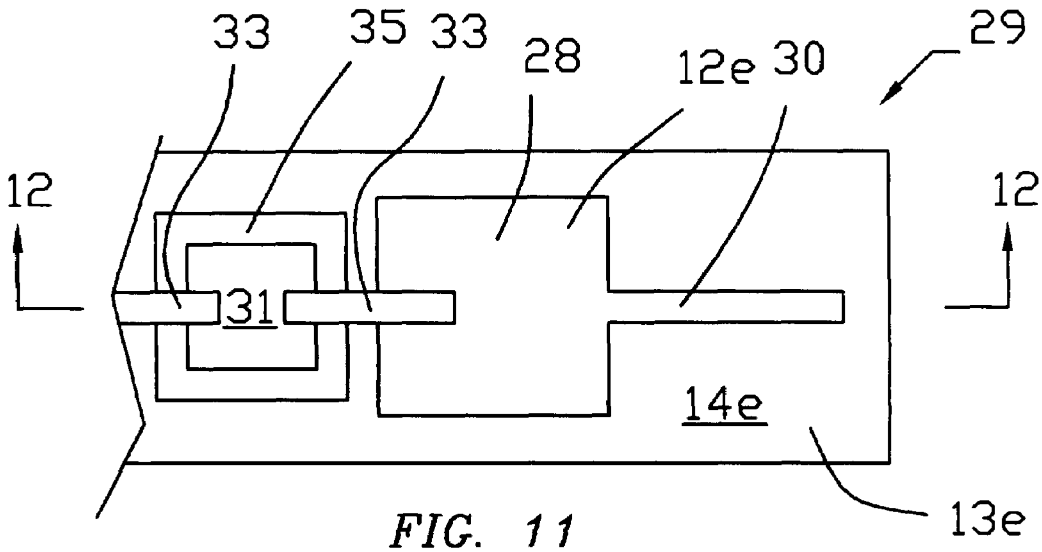
FIG. 11 is a top plan view of an intermediate article in the process of attaching metal inserts to conductive surface traces.
Figure 12:
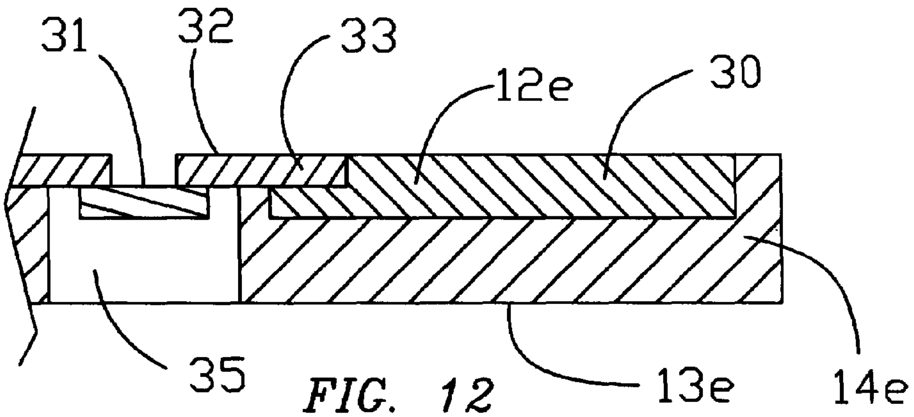
FIG. 12 is a sectional view of the article of FIG. 11 taken substantially from the perspective of line 12-12 of FIG. 11.
Figure 13:
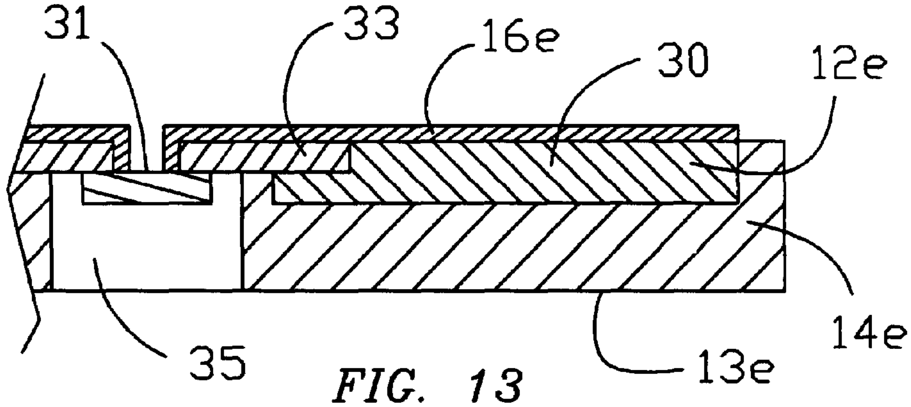
FIG. 13 is a sectional view showing the article of the embodiment of FIGS. 11 and 12 following an additional processing step.

FIGS. 11 through 13 illustrate an alternate method for electrically connecting the electrical leads of a device to conductive patterns produced using DER/electrodeposit composites. FIG. 11 shows a top plan view of an article, identified as 29, combining a device 31 with a DER pattern. The electrical device, indicated as 31, is positioned in a hole 35 in substrate 13*e*. Substrate 13*e* comprises electrically insulating material 14*e*. Device 31 includes electrical leads 33 which are normally metallic. A DER pattern 12*e* comprises pad 28 and elongated strip 30. Strip 30 could form, for example, an antenna pattern. Electrical device 31, leads 26 and DER pattern 12*e* are supported by insulating substrate 14*e*. FIG. 12 is a sectional view taken substantially from the perspective of line 12-12 of FIG. 11. In FIG. 12 it is seen that device lead 33 is embedded into the DER material 12*e* to the extent that at least a portion of the surface of lead 33, indicated by 32, remains exposed. Embedding the leads 33 can be done by known techniques such as heat staking or molding of the DER material around a portion of lead 33 (insert molding). FIG. 13 is a sectional view similar to FIG. 12 following an additional processing step of electroplating metal-based material 16*e*. It is seen in FIG. 13 that metal-based electrodeposit extends continuously over the originally exposed surface of leads 33 to the DER (12*e*) pattern. The electrodeposit 16*e* forms a robust, continuous and highly conductive connection between the lead 33 and the now metal plated, highly conductive pattern 31 originally defined by the DER material.

A number of factors allow this electrical connection through electrodeposition. First, adequate bonding between metals and subsequent electrodeposits normally requires some sort of cleaning treatment to remove contaminants or oxides from the metallic surface. Proper selection of the polymeric base resin for the DER allows these materials to be unaffected by required metal cleaning treatments. Second, since DER's are plated without any requirement for very harsh chemical etching treatments used to plate plastics by conventional means, potential damage to the metallic leads from such treatments is avoided. Third, as discussed above, any detrimental penetration of electroplating solution into the interfacial area between the metallic lead and the DER has not been observed as a problem. Indeed, excellent bridging of electrodeposits between metallic leads and the DER materials has been characteristic. However, were such solution penetration to be a problem, a simple pre-dip of the structure in distilled water would cause the interfacial volume to fill with innocuous water rather than any harsher chemical solutions.

Figure 14:
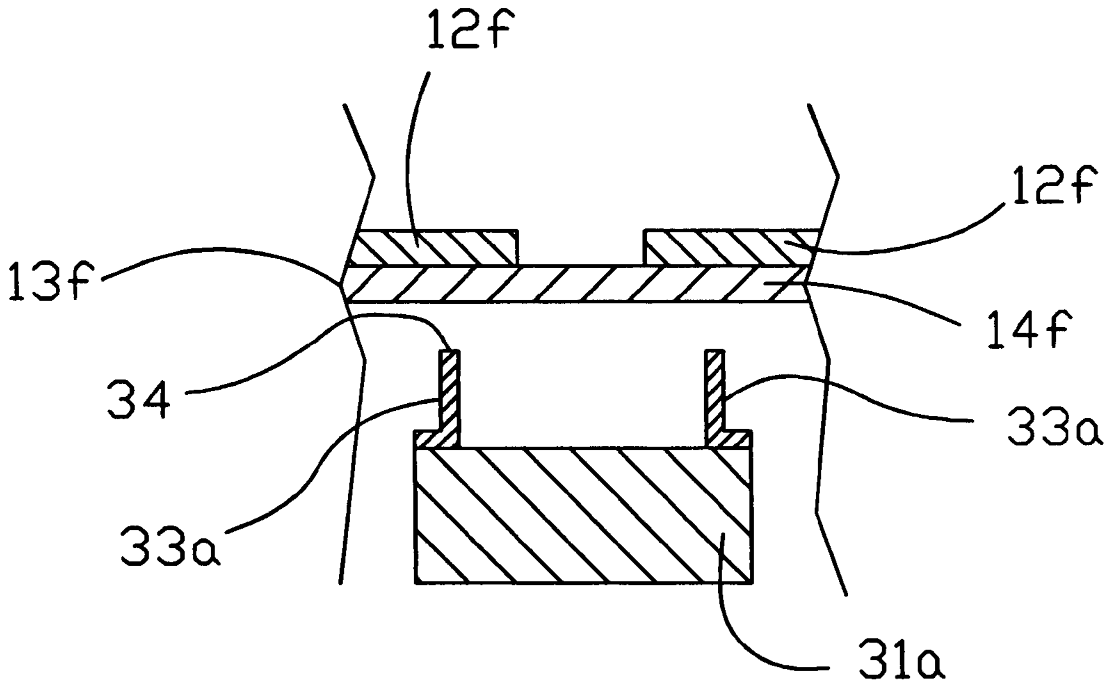
FIG. 14 is a sectional view illustrating article positioning for an alternate process for attaching metal inserts to conductive surface traces.
Figure 15:
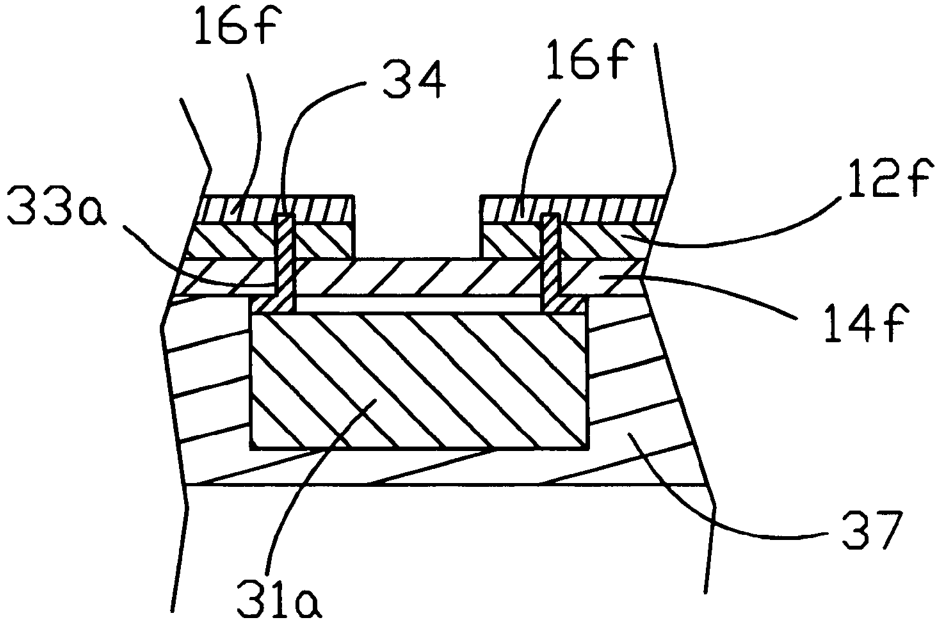
FIG. 15 is a sectional view of the embodiment of FIG. 14 following additional processing steps.

In the embodiment of FIG. 13, it is seen that the device 24 remains exposed to electroplating solutions during deposition of metal-based layer 16*e*. Damage to the device from this exposure is avoided in that the device is normally encapsulated in a protective resin moisture barrier, with only the metallic leads 33 exposed. However, in some applications one may wish to further isolate the device from the electroplating solutions. A process to completely isolate the device from the electroplating solutions during the electrodeposition is illustrated in FIGS. 14 and 15. In FIG. 14, device 31*a* with leads 33*a* is positioned beneath insulating support substrate 13*f*. DER pattern is positioned on the upper surface of support substrate 13*f*.

FIG. 15 is a sectional view of this embodiment after a number of additional processing steps as follows. First, the device 31*a* has been moved relative to insulator/DER structure 14*f*/12*f* so that the terminal ends 34 of leads 33*a* penetrate through the DER layer 12*f* and are exposed. Next, a layer of additional insulating material 37 is applied to encapsulate device 31*a*. This additional insulating layer can be applied by known techniques such as solution coating or film laminating. Finally, a layer of electrodeposited metal-based material 16*f* is deposited to electrically connect the terminal ends 34 of leads 33*a* to the metal-based pattern simultaneously formed by electroplating the DER 12*f*.

One will appreciate in light of the teachings associated with FIGS. 11 through 15, that the attachment of a metal component to a conductive trace through the steps of embedding in a DER material followed by electroplating is not restricted to the leads of a particular device. Other metallic inserts, such as wires, connectors, spring contacts etc. can be considered for electrical attachment using these techniques.

Figure 16:
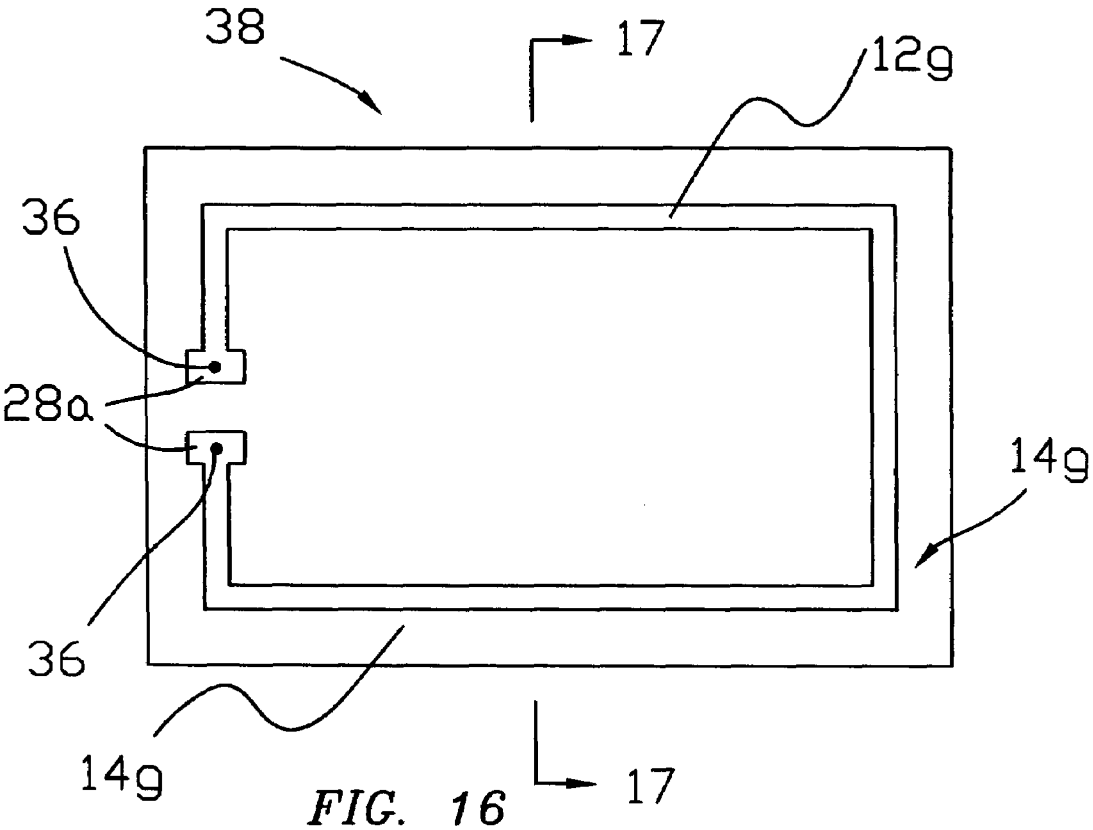
FIG. 16 is a top plan view of an intermediate article in the manufacture of a low profile loop antenna according to the teachings of the invention.
Figure 17:
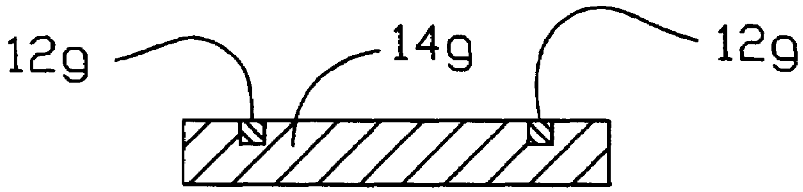
FIG. 17 is a sectional view taken substantially from the perspective of line 17-17 of FIG. 16.
Figure 18:
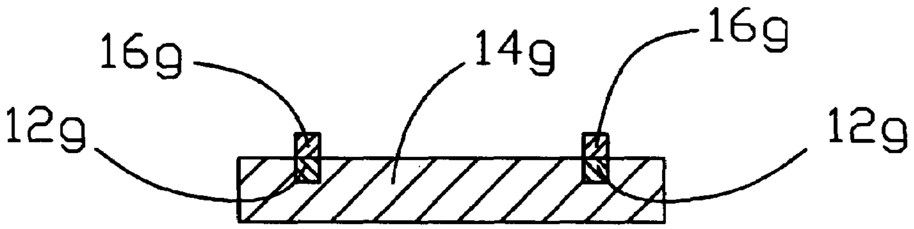
FIG. 18 is a sectional view of the intermediate article of FIGS. 16 and 17 following an additional processing step.

FIGS. 16 through 18 illustrate an embodiment of a low profile loop antenna produced by the teachings of the present invention. FIG. 16 is a top plan view of the starting structure indicated as 38. Structure 38 has a loop formed by a trace of DER material 12*g* supported on insulating material 14*g*. Device mounting pads 28*a* are included in the pattern formed by DER material 12*g*. Device mounting holes 36 are located in pads 38*a* for accurately locating the leads of an electronic device (not shown).

FIG. 17 is a sectional view taken substantially from the perspective of line 17-17 of FIG. 16. FIG. 17 shows DER 12*g* loop trace being embedded in insulating substrate material 14*g* in a fashion similar to the structure of FIG. 2. FIG. 18 shows the cross-sectional structure following an additional processing step of electroplating metal-based material 16*g* onto the DER material 12*g*. An electrical device (not shown) may be attached to pads 28*a* and simultaneously electrically connected to the DER/electrodeposit loop by techniques discussed in conjunction with FIGS. 11 through 15. Material 16*g* now forms a highly conductive, low profile loop antenna/inductor to transmit information and/or power an electrical device (not shown) attached at pads 28*a*. Such an antenna is substantially flat, simple to mass produce, and physically and electrically robust. Such an antenna would be very suitable for production of low profile items such as a contactless “smart card” or RFID tag.

Figure 19:
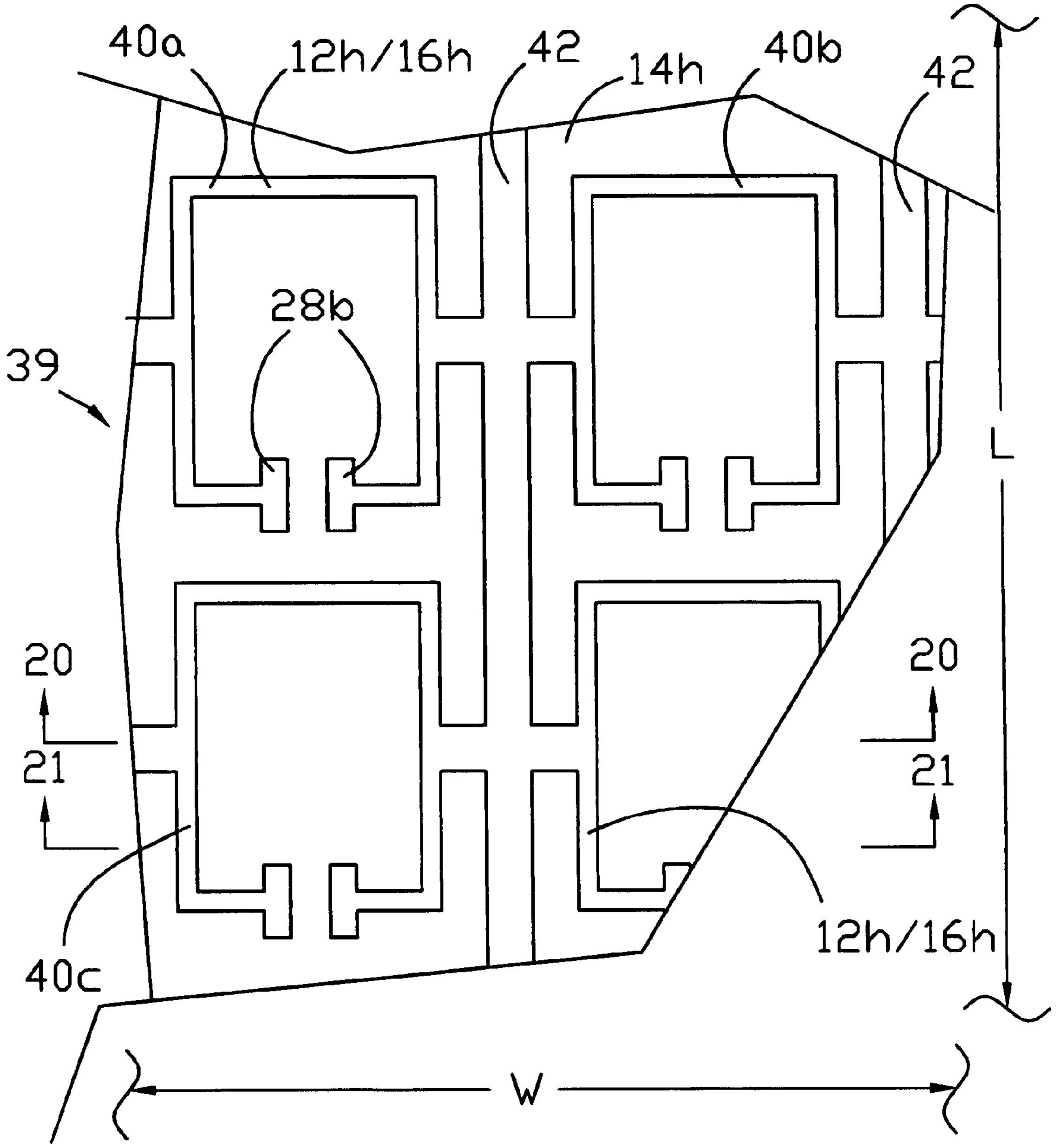
FIG. 19 is a top plan view of a structural arrangement in the mass production of substantially planar loop antennas according to the teachings of the invention.

FIGS. 19 through 23 illustrate a method of inexpensive mass production of a form of the low profile loop antenna introduced in FIGS. 16 through 18. In FIG. 19, a web of substantially planar structure is identified generally as 39. Structure 39 has a length in the direction designated by the letter “L” and width designated by the letter “W”. In the embodiment of FIG. 19, length “L” is contemplated to be considerably larger than width “W” and thus structure 39 can be processed in roll-to-roll fashion.

Structure 39, FIG. 19, is characterized by the following factors. Electrically insulating sheet 14*h* supports a pattern of DER/electrodeposit composite material 12*h*/16*h* having multiple loops 40*a*, 40*b*, 40*c*, similar to those taught in conjunction with FIG. 16 through 18. Loop traces 40*a*, 40*b*, 40*c* . . . include mounting pads 28*b*. “Buss” DER/electrodeposit traces 42 are disposed between the DER loop traces 40*a*, 40*b*, 40*c* . . .

The initial structural arrangement of DER material 12*h* supported on a web of insulating material 14*h* can be produced by known techniques, including programmed extrusion of thermoplastic DER or printing of a DER formulation dissolved in solvent to form an ink. The pattern of DER loops can then be directly electroplated by continuously passing the web having the DER pattern disposed thereon through appropriate electroplating baths. In the electroplating operation, “busses” 42 provide electrical communication to conduct the electrodeposition current to the individual loops.

Figure 20:
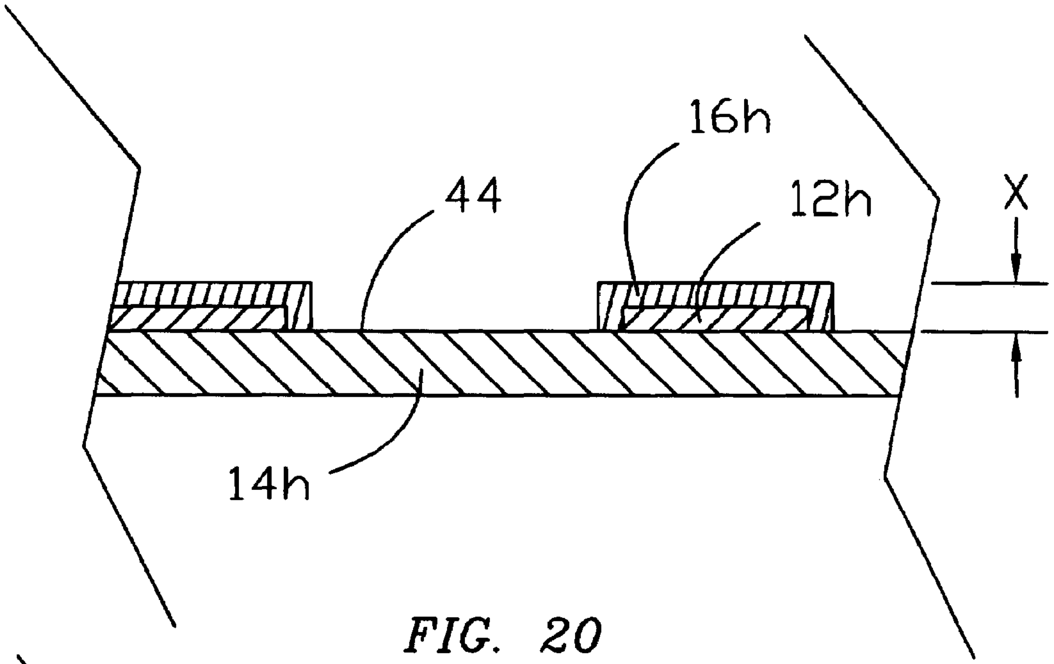
FIG. 20 is a sectional view taken substantially from the perspective of line 20-20 of FIG. 19.
Figure 21:
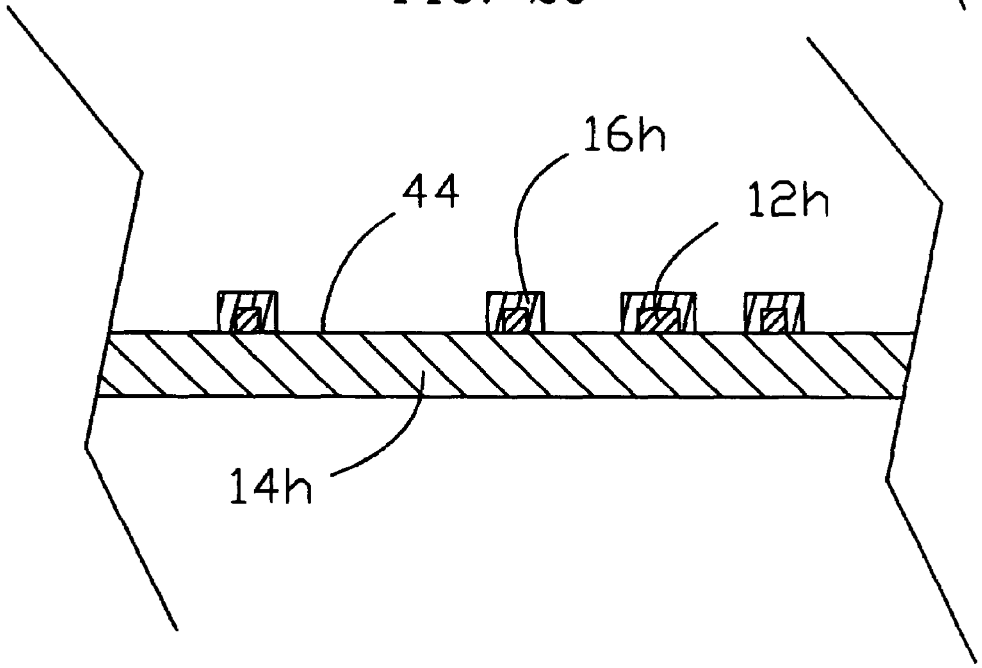
FIG. 21 is a sectional view taken substantially from the perspective of line 21-21 of FIG. 19.

FIGS. 20 and 21 are sectional views of the FIG. 19 structure taken substantially from the perspective of lines 20-20 and 21-21 of FIG. 19. FIGS. 20 and 21 show that the DER and electrodeposit, 12*h* and 16*h* respectively, are positioned on the top surface 44 of supporting insulating material 14*h*. Such a positioning is likely more easily achieved for the continuous web processing envisioned as compared to the embedded placement of the DER 12*g* in substrate 14*g* shown in the embodiments of FIGS. 16 through 18. Nevertheless, the total thickness of the composite DER/electrodeposit traces, indicated by dimension “X” in FIG. 20 can be made relatively small, approximately 75 micrometers. Thus, the low profile of the conductive traces is maintained.

Figures 22, 23:
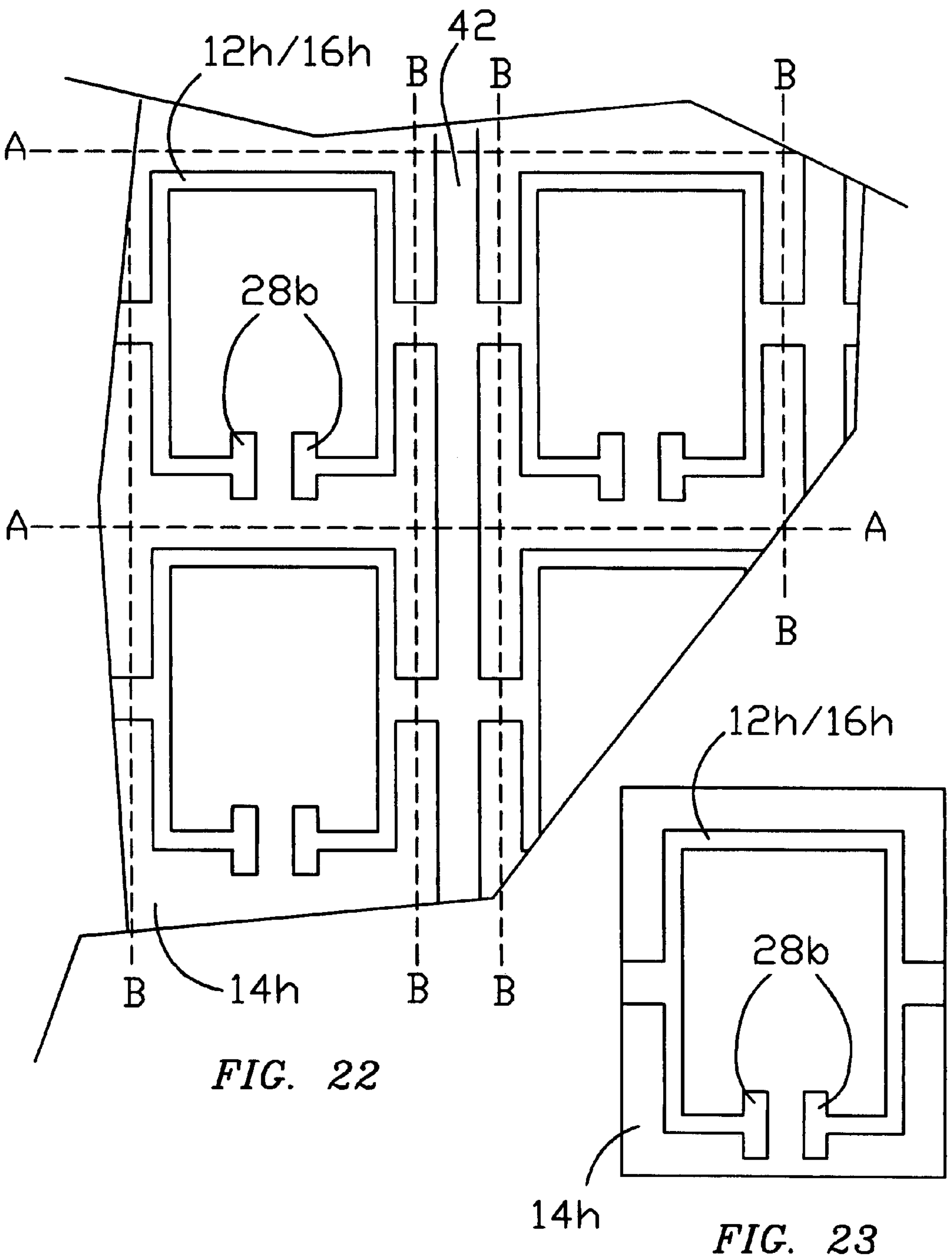
FIG. 22 is a top plan view similar to FIG. 19 indicating a cut line pattern for subdividing the arrangement to produce multiple individual loop antennas.
FIG. 23 is a top plan view of the individual antenna produced by the subdividing along the lines indicated in FIG. 22.

FIG. 22 is an additional plan view of the embodiment of FIGS. 19 through 21 showing dashed lines A, B along which the completed web is subdivided. This can be accomplished by known techniques such as slitting or punching. The subdividing results in individual conductive loop structures as shown in FIG. 23. It is understood that additional operations, such as attachment of an electrical device to pads 28*b* of the individual loops, can be considered while the web is in its initial “continuous” form prior to subdivision.

Figure 24:
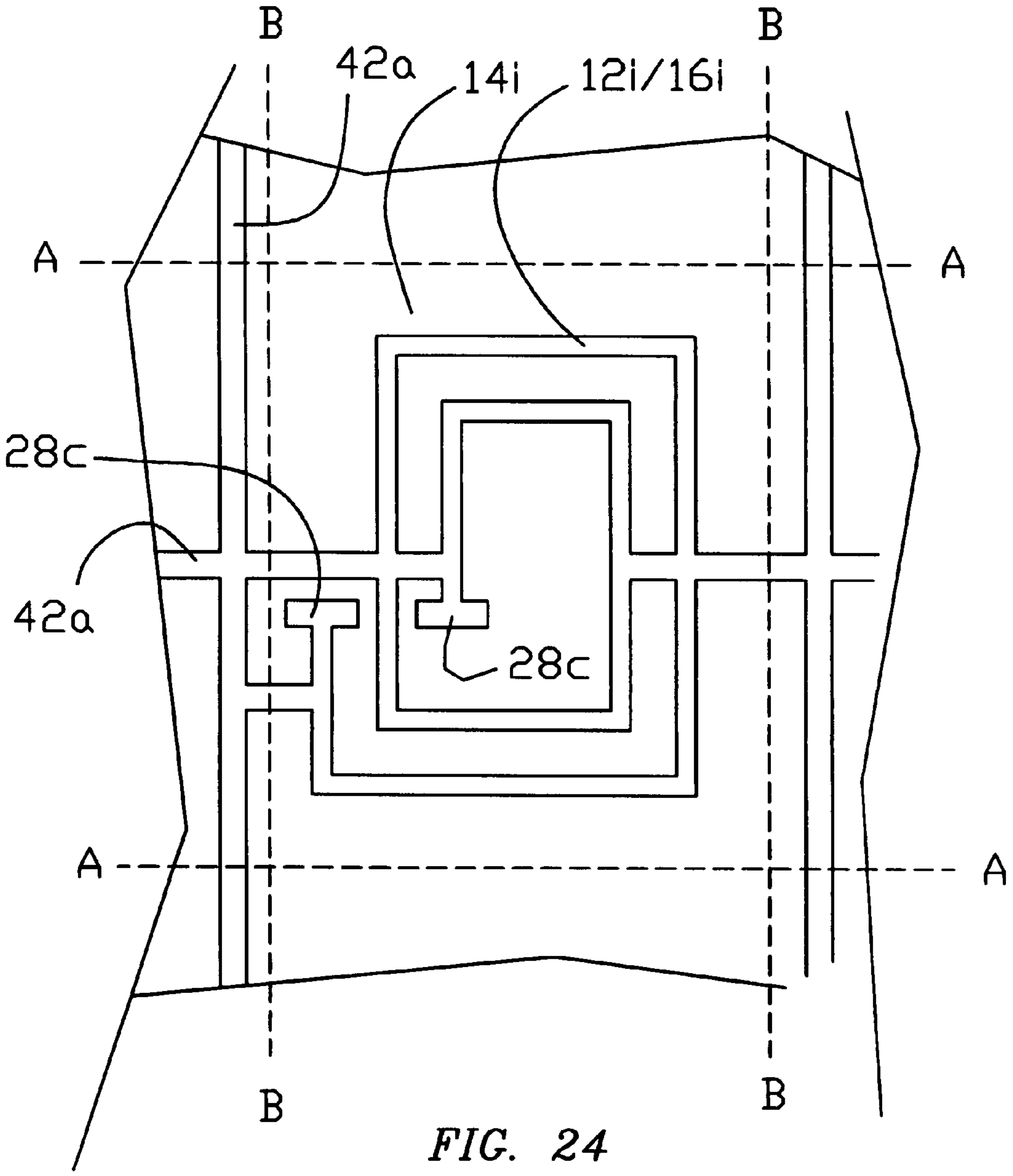
FIG. 24 is a top plan view of intermediate article in production of multiple loop, low profile antennas according to the teachings of the invention.
Figure 25:
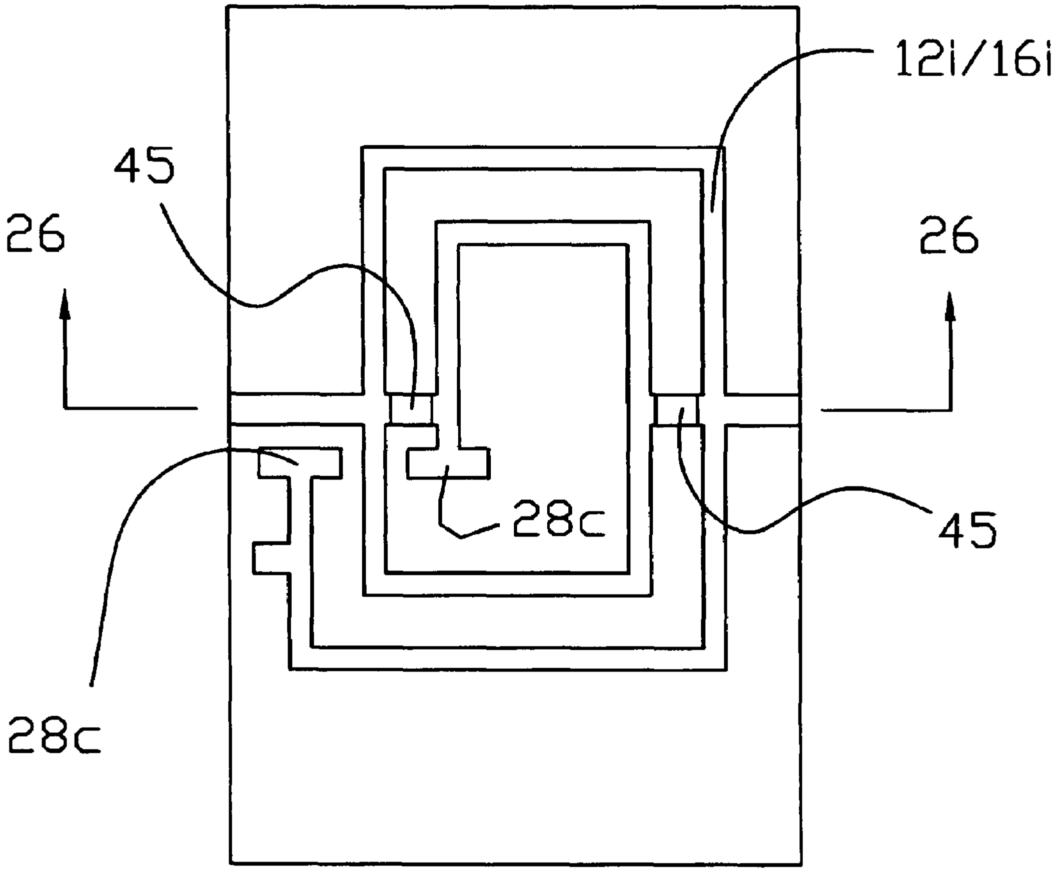
FIG. 25 is a top plan view of a discrete multiple loop, low profile antenna produced by additional processing of the article of FIG. 24.
Figure 26:
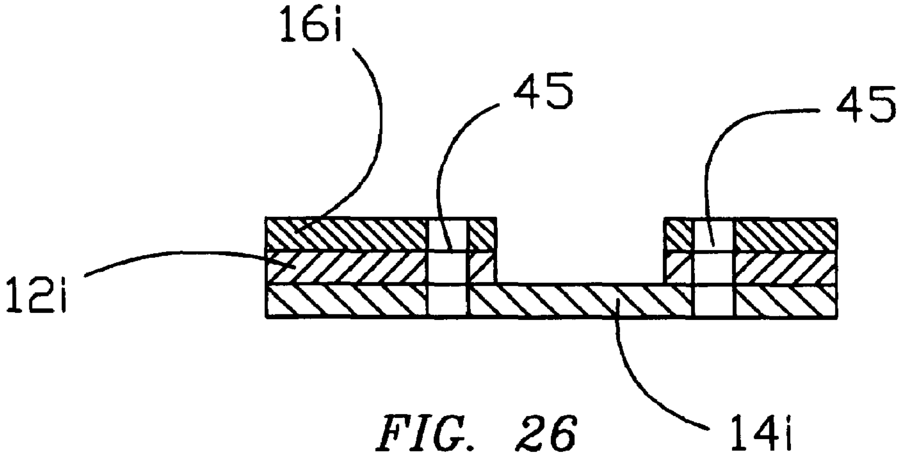
FIG. 26 is a sectional view of the article embodied in FIG. 25 taken substantially from the perspective of line 26-26 of FIG. 25.

The embodiments of FIGS. 16 through 23 illustrate a single loop of a highly conductive, low profile trace suitable for an antenna/inductor. In some cases, multiple loops of the conductive trace would be desirable. FIGS. 24 through 26 illustrate a method for production of such a multiple loop trace. FIG. 24, a top plan view similar to FIG. 19, shows a pattern of DER/electrodeposit trace 12*i*/16*i* supported on insulating material 14*i*. The pattern includes buss structure 42*a*, whose function was previously discussed in conjunction with FIGS. 19 through 23, and pads 28*c*. FIG. 25 is a top plan view of the article produced by removing portions of the structure of FIG. 24. The structure of FIG. 25 is produced by slitting or otherwise cutting the web along the lines generally indicated by the dashed lines A and B of FIG. 24. In addition, holes 45 are punched to remove connecting portions of the trace to complete the multiple loop arrangement. FIG. 26, a sectional view taken from the perspective of line 26-26 of FIG. 25, further illustrates the structural arrangement following the slitting and punching operations.

What is claimed is:

1. An electrical connection between an electrical device and an antenna, said antenna having a structural pattern, at least a portion of said antenna structural pattern being defined by a first material capable of being coated with an electrodeposit, said electrical device having a connection surface, at least a portion of said connection surface being formed by a second material, said second material being electrically conductive, said connection characterized as comprising an electrodeposit overlaying at least a portion of said first material and in electrical communication with said second material.

2. The electrical connection of claim 1 wherein said antenna comprises said electrodeposit.

3. The connection of claim 1 wherein at least one of said first and second materials comprises an electrically conductive polymer.

4. The connection of claim 3 wherein said electrically conductive polymer comprises carbon black.

5. The connection of claim 3 wherein said electrically conductive polymer comprises one or more metallic fillers.

6. The connection of claim 3 wherein said electrically conductive polymer comprises a directly electroplateable resin (DER).

7. The connection of claim 6 wherein said directly electroplateable resin comprises carbon black.

8. The connection of claim 6 wherein said directly electroplateable resin comprises sulfur or a sulfur donor.

9. The connection of claim 3 wherein said electrically conductive polymer comprises a metallic filler.

10. The connection of claim 1 wherein said electrodeposit is metal based.

11. The connection of claim 1 wherein said electrodeposit comprises an element chosen from Group VIII.

12. The connection of claim 1 further comprising an additional metallic layer contacting at least a portion of said electrodeposit.

13. The connection of claim 1 used as a component of an article for wireless transmission.

14. The connection of claim 1 used in an RFID tag.

15. The connection of claim 1 wherein said electrical device comprises a chip.

16. The connection of claim 1 wherein said antenna is characterized as having a low profile.

17. The connection of claim 1 wherein said first material has the same composition as said second material.

18. Multiple connections according to claim 1, wherein said antenna structural patterns are positioned on an insulating support structure.

19. The multiple connections of claim 18 wherein said insulating support structure is a substantially planar web.

20. The multiple connections of claim 19 wherein said web can be characterized as being continuous.

21. Multiple electrical connections between electrical devices and respective antenna structural patterns, said electrical devices having at least one connection surface, said antenna structural patterns being at least partially defined by an electroplateable material capable of being coated with an electrodeposit, said multiple connections characterized as comprising an electrodeposit in electrical communication with said connection surface and extending to overlay at least a portion of said electroplateable material, said structural patterns being joined by a buss to provide electrical communication among said patterns.

22. The multiple electrical connections of claim 21 wherein said buss comprises an electrically conductive polymer.

23. The multiple electrical connections of claim 22 wherein said electrically conductive polymer comprises a directly electroplateable resin.

* * * * *